United States Patent
Lu et al.

(10) Patent No.: US 9,461,589 B2
(45) Date of Patent: Oct. 4, 2016

(54) ASYMMETRIC H-BRIDGE IN A CLASS D POWER AMPLIFIER

(71) Applicant: QUALCOMM Incorporated, San Diego, CA (US)

(72) Inventors: Jingxue Lu, San Diego, CA (US); Ankit Srivastava, San Diego, CA (US); Haibo Fei, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/475,822

(22) Filed: Sep. 3, 2014

(65) Prior Publication Data

US 2016/0065134 A1    Mar. 3, 2016

(51) Int. Cl.
| | |
|---|---|
| H03F 1/02 | (2006.01) |
| H03F 3/217 | (2006.01) |
| H03F 3/183 | (2006.01) |
| H03F 1/52 | (2006.01) |
| H03F 3/45 | (2006.01) |

(52) U.S. Cl.
CPC ............ *H03F 1/0205* (2013.01); *H03F 1/523* (2013.01); *H03F 3/183* (2013.01); *H03F 3/217* (2013.01); *H03F 3/2173* (2013.01); *H03F 3/45179* (2013.01); *H03F 3/45475* (2013.01); *H03F 2200/03* (2013.01); *H03F 2200/33* (2013.01); *H03F 2200/351* (2013.01); *H03F 2200/481* (2013.01)

(58) Field of Classification Search
USPC ........................................ 330/10, 207 A, 251
See application file for complete search history.

(56) References Cited

U.S. PATENT DOCUMENTS

| | | | |
|---|---|---|---|
| 5,077,539 A | 12/1991 | Howatt | |
| 5,973,569 A | 10/1999 | Nguyen | |
| 7,268,621 B2 | 9/2007 | Kanoh et al. | |
| 7,286,010 B2* | 10/2007 | Chieng | H03F 3/2173 330/10 |
| 7,312,654 B2* | 12/2007 | Roeckner | H03F 1/305 330/10 |
| 8,378,745 B2 | 2/2013 | Dooper et al. | |
| 8,437,478 B2 | 5/2013 | Kost | |
| 2013/0223649 A1 | 8/2013 | Srivastava et al. | |
| 2013/0285744 A1 | 10/2013 | Fei et al. | |

FOREIGN PATENT DOCUMENTS

CN         101557203 A     10/2009

OTHER PUBLICATIONS

Microchip, "Dual Full-Bridge Motor Driver," MTS2916A, Microchip Technology Inc., 2010-2013, DS22259C-p. 1 to DS22259C-p. 20.
International Search Report and Written Opinion—PCT/US2015/047682—ISA/EPO—Nov. 27, 2015.

* cited by examiner

*Primary Examiner* — Hieu Nguyen
(74) *Attorney, Agent, or Firm* — Haynes and Boone, LLP

(57) ABSTRACT

Disclosed is an amplifier circuit having an output stage that includes an H-bridge circuit. The H-bridge circuit includes sense resistors on one side of the circuit. A current detection circuit can produce an output indicative of current flow through a load based on voltages across the sense resistors.

21 Claims, 6 Drawing Sheets

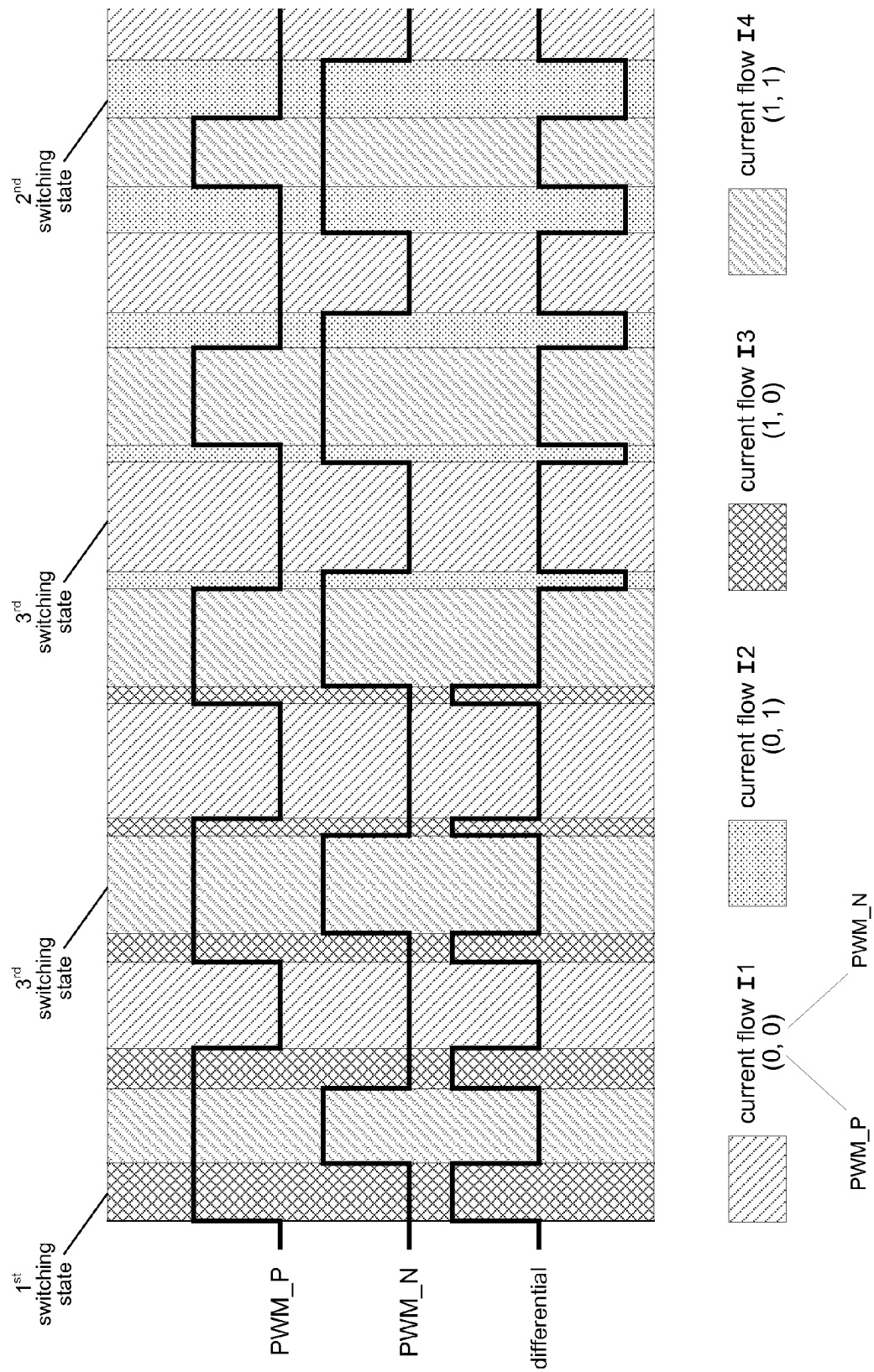

ASYMMETRIC H-BRIDGE IN A CLASS D POWER AMPLIFIER

BACKGROUND

Unless otherwise indicated, the foregoing is not admitted to be prior art to the claims recited herein and should not be construed as such.

Power amplifiers are commonly used in various applications such as speaker drivers, headphone amplifiers, telephone line drivers, etc. There are several classes of power amplifiers, including for example, Class A, Class, B, and Class D amplifiers.

In a Class A amplifier, the output devices are continuously conducting for the entire cycle, or in other words there is always bias current flowing in the output devices. This topology has the least distortion and is the most linear, but at the same time is the least efficient because of the continuous operation of the amplifier.

In a Class B amplifier, the output devices only conduct for half the sinusoidal cycle (one conducts in the positive region, and one conducts in the negative region). If there is no input signal, then there is no current flow in the output devices. Class B amplifiers operate more efficiently than Class A amplifiers, but at the cost linearity at the crossover point between conduction and non-conduction.

A Class D amplifier is a switching or PWM amplifier. In this kind of amplifier, the switches are either fully on or fully off, significantly reducing the power losses in the output devices. The audio signal is used to modulate a PWM carrier signal which drives the output devices, with the last stage being a low pass filter to remove the high frequency PWM carrier frequency.

Portable electronic devices (smart phones, MP3 players, computer tablets, etc.) typically use miniature speakers, which tend not to be very robust and can fail due to overheating. An important consideration with high-end Class D amplifiers, therefore, is the ability to measure the load impedance in order to protect the speaker from being damaged.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings:

FIGS. 4 and 4A illustrate current flows in an output stage in accordance with the present disclosure.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
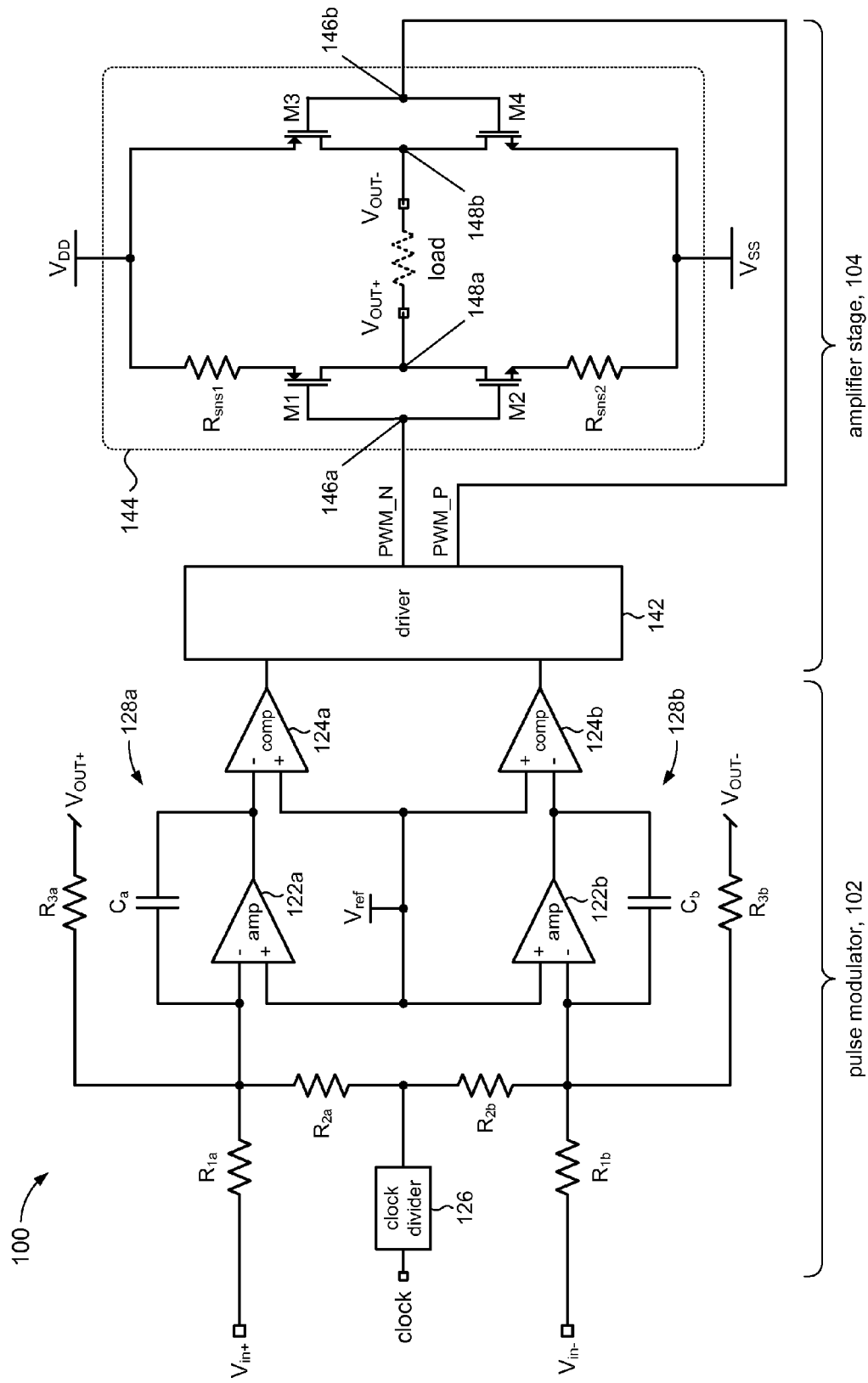
FIG. 1 is a high level block diagram of an amplifier in accordance with the present disclosure.

FIG. 1 shows a high level block diagram of an illustrative embodiment of a Class D amplifier 100 in accordance with the present disclosure. The amplifier 100 may include a pulse modulator 102 and an amplifier stage 104. In the embodiment shown, the pulse modulator 102 is configured to receive a differential input. The amplifier stage 104 may drive a load such as a speaker, for example.

In some embodiments, the pulse modulator 102 may include a non-inverting path for a non-inverting input signal $V_{in+}$. The non-inverting path may comprise an input resistor $R_{1a}$, an integrator 128a, and a comparator 124a. The integrator 128a may comprise an amplifier 122a (e.g., an op amp), capacitor $C_a$, and resistors $R_{1a}$ and $R_{3a}$. Resistor $R_{3a}$ may serve as a feedback resistor that couples the amplifier output $V_{OUT+}$ as a feedback signal back to the pulse modulator 102. The amplifier 122a and comparator 124a may be referenced to $V_{ref}$. The output of comparator 124a may feed into a driver circuit 142.

The pulse modulator 102 may further include an inverting path for an inverting input signal $V_{in-}$. The inverting path may comprise an input resistor $R_{1b}$, an integrator 128b, and a comparator 124b. The integrator 128b may comprise an amplifier 122b (e.g., an op amp), capacitor $C_b$, and resistors $R_{1b}$ and $R_{3b}$. Resistor $R_{3b}$ may serve as a feedback resistor that couples the amplifier output $V_{OUT-}$ as a feedback signal back to the pulse modulator 102. The amplifier 122b and comparator 124b may be referenced to $V_{ref}$. The output of comparator 124b may feed into driver circuit 142.

The pulse modulator 102 may further include a clock divider 126 and resistors $R_{2a}$, $R_{2b}$ to couple the output of the clock divider to respective integrators 128a, 128b. The clock divider 126 may receive a clock signal and divide-down the frequency of the clock signal. The clock divider 126 may output a square wave at the divided-down clock frequency to be combined with the $V_{in+}$ and $V_{in-}$ input signals via resistors $R_{2a}$ and $R_{2b}$, respectively.

The integrator 128a is operative to sum the input signal $V_{in+}$ (via $R_{1a}$), the divided-down clock signal (via $R_{2a}$), and the feedback signal $V_{OUT+}$ (via $R_{3a}$) to produce an integrated signal that is input to the comparator 124a. The comparator 124a may compare the integrated signal against $V_{ref}$ and generate a first PWM driver signal. Similarly, the integrator 128b is operative to sum the input signal $V_{in-}$ (via $R_{1b}$), the divided-down clock signal (via $R_{2b}$), and the feedback signal $V_{OUT-}$ (via $R_{3b}$) to produce an integrated signal that feeds in to the comparator 124b. The comparator 124b may compare the integrated signal against $V_{ref}$ and generate a second PWM driver signal.

The amplifier stage 104 may comprise driver circuit 142 and an output stage 144. The driver circuit 142 amplifies the first and second PWM driver signals from respective comparators 124a and 124b to produce higher amplitude control signals PWM_N and PWM_P suitable to drive the output stage 144.

In accordance with the present disclosure, the output stage 144 may comprise an H-bridge circuit comprising switches M1, M2, M3, and M4, and sense resistors $R_{sns1}$ and $R_{sns2}$. In some embodiments, the switches M1-M4 may be field effect transistor (FET) devices. In a particular embodiment, for example, switches M1 and M3 are p-channel metal oxide semiconductor (MOS) FETs and switches M2 and M4 are n-channel MOS FETs. The PWM_N control signal may be connected to a node 146a of the H-bridge and the PWM_P control signal may be connected to a node 146b of the H-bridge. In accordance with the present disclosure, the sense resistors $R_{sns1}$, $R_{sns2}$ may be connected entirely on one side of the H-bridge, such as illustrated in FIG. 1 for example. The output stage may include output nodes 148a and 148b for a connection to a load (e.g., a speaker, motor, etc.).

In operation, the pulse modulator 102 generates 3-state PWM switching drive signals to drive the output stage 144 in three switching states. Thus, in a first switching state, the output stage 144 can connect the outputs $V_{OUT+}$ and $V_{OUT-}$ to the $V_{DD}$ and $V_{SS}$ power rails respectively. In a second switching state, the output stage 144 can connect the outputs $V_{OUT+}$ and $V_{OUT-}$ to the $V_{SS}$ and $V_{DD}$ power rails respectively. In a third switching state (sometimes referred to as the "zero output" state), the outputs $V_{OUT+}$ and $V_{OUT-}$ can both be connected either to $V_{DD}$ or to $V_{SS}$.

Figure 1A:
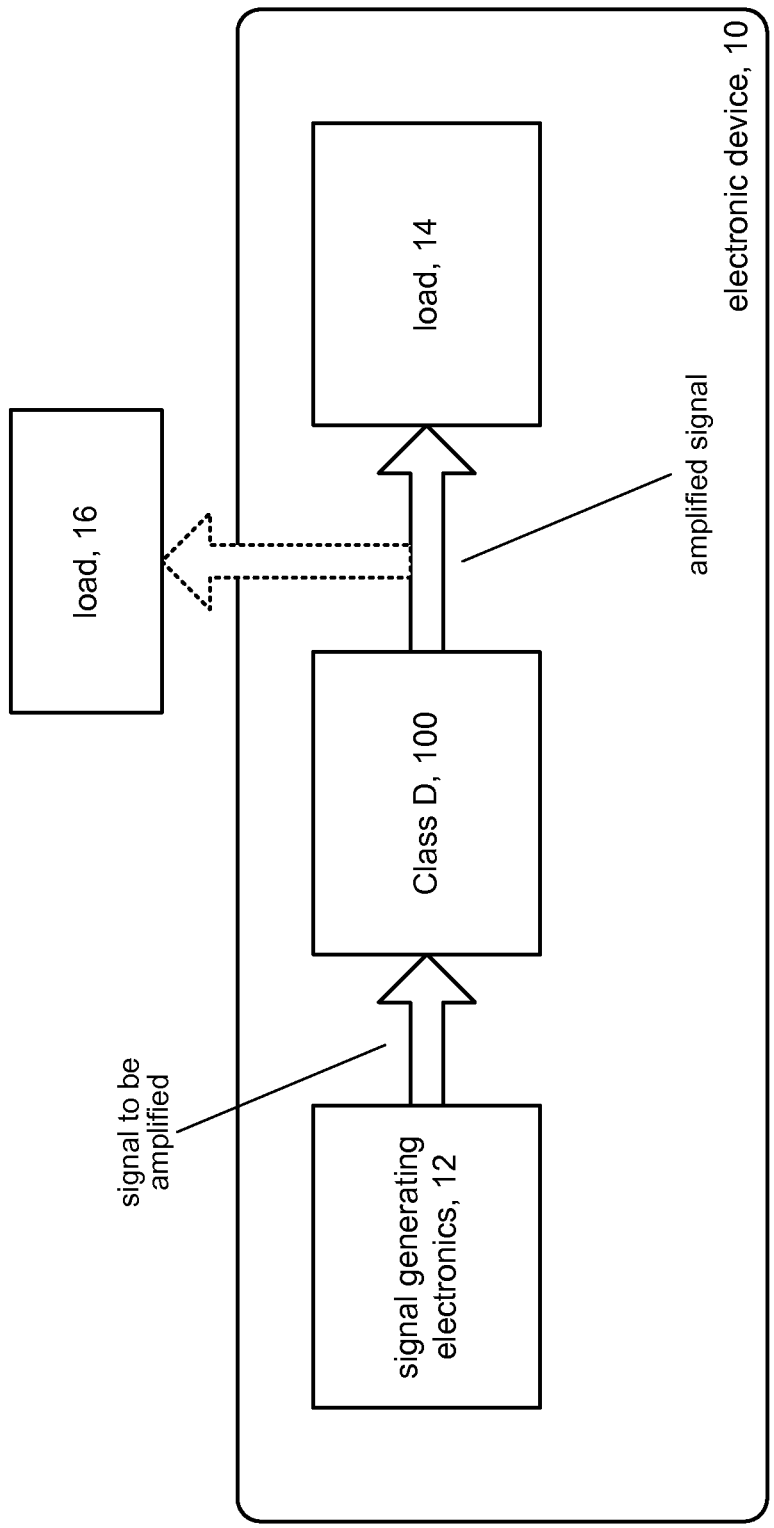
FIG. 1A is a block diagram illustrating how an amplifier in accordance with the present disclosure may be incorporated in an electronic device.

Referring now to FIG. 1A, a high level block diagram shows how an amplifier in accordance with the present disclosure (e.g., amplifier 100) may be incorporated into an electronic device 10. The electronic device 10 may include signal generating electronics 12 to generate a signal to be amplified. The signal generating electronics 12 can provide the signal to a Class D amplifier (e.g., amplifier 100) to produce an amplified signal. The electronic device 10 may include a load 14 that the Class D amplifier can drive. In some embodiments, the electronic device 10 may be connectable to an external load 16 that the Class D amplifier can drive. For example, the electronic device 10 may be an MP3 player and the load 14 may be a built-in speaker. The external load 16 may be a headset that can be plugged into the electronic device 10. Other examples of electronic device 10 include smartphone, computer tablet, etc.

Figure 2:
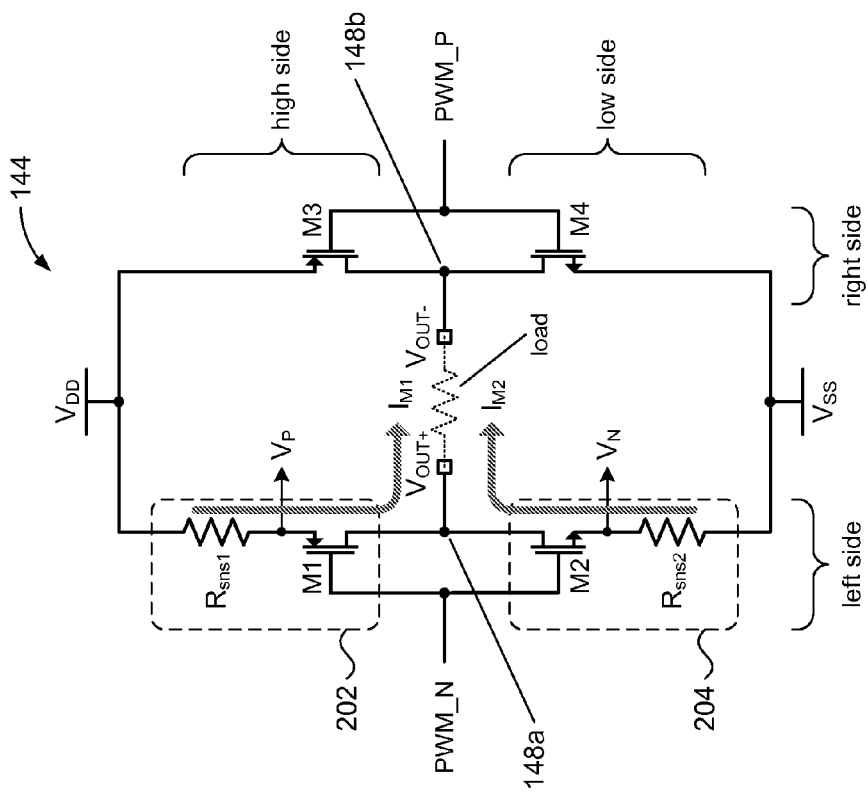
FIG. 2 illustrates details of an output stage in accordance with the present disclosure.

Referring to FIG. 2, additional details of the output stage 144 will be described. The H-bridge circuit that comprises the output stage 144 may be viewed as having a "left side" driving side and a "right side" driving side, as depicted in the figure. In accordance with the present disclosure, the left side of the H-bridge may comprise a first switching unit 202 that is connected between a first power rail $V_{DD}$ (having a voltage $V_{DD}$) and one side of the node 148a. The left side of the H-bridge may further comprise a second switching unit 204 that is connected between the other side of the node 148b and a second power rail $V_{SS}$ (having a voltage $V_{SS}$). In some embodiments, the voltage $V_{DD}$ is greater than the voltage $V_{SS}$. In some embodiments, for example, the voltage $V_{SS}$ may be ground potential. In other embodiments, the voltage $V_{SS}$ may be equal to $-V_{DD}$, and so on. In configurations where the voltage $V_{DD}$ is higher than the voltage $V_{SS}$, the portion of the H-bridge between the first power rail $V_{DD}$ and nodes 148a/148b is sometimes referred to as the "high" side, while the portion of the H-bridge between the second power rail $V_{SS}$ and nodes 148a/148b is sometimes referred to as the "low" side. In some embodiments, according to the present disclosure, the high-side right of the H-bridge may comprise only switch M3 (i.e., is absent a sense resistor), and the low-side left of the H-bridge may comprise only switch M4 (i.e., is absent a sense resistor).

In accordance with the present disclosure, the switching unit 202 may comprise switch M1 and sense resistor $R_{sns1}$ connected in series. In a particular embodiment, such as shown in FIG. 2, the sense resistor $R_{sns1}$ is connected between the first power rail $V_{DD}$ and switch M1. Switch M1, in turn, is connected between $R_{sns1}$ and node 148a. A voltage signal $V_P$ may be sensed at the connection between $R_{sns1}$ and switch M1. Voltage $V_P$ indicates a voltage drop across $R_{sns1}$ and thus is representative of a current flow through $R_{sns1}$.

Similarly, the switching unit 204 may comprise switch M2 and sense resistor $R_{sns2}$ connected in series. In a particular embodiment, such as shown in FIG. 2, switch M2 is connected between node 148a and sense resistor $R_{sns2}$. Sense resistor $R_{sns2}$, in turn, is connected between switch M2 and the second power rail $V_{SS}$. A voltage signal $V_N$ may be sensed at the connection between switch M2 and $R_{sns2}$. Voltage $V_N$ indicates a voltage drop across $R_{sns2}$ and thus represents a current flow through $R_{sns2}$.

During circuit operation, the sense signals $V_P$ and $V_N$ can continuously sense an output current flowing across a load connected to nodes 148a, 148b. When the output current exceeds a predetermined threshold, the amplifier 100 may be disconnected from the load. In some embodiments, for example, switches (not shown) may be employed to disconnect the load from the amplifier 100. In other embodiments, the amplifier 100 itself may be disabled, and so on.

Figure 3:
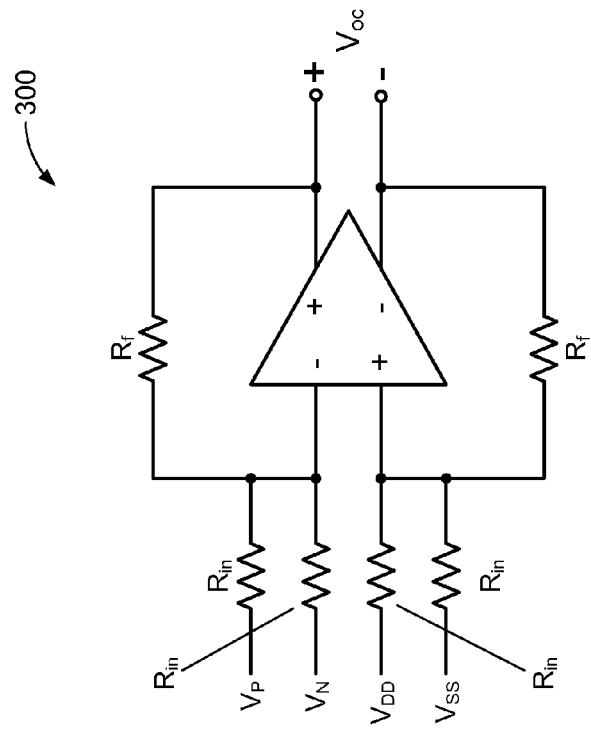
FIG. 3 shows an illustrative overcurrent detection circuit in accordance with the present disclosure.

FIG. 3 shows an overcurrent detection circuit 300 that can process the sense signal $V_P$ and $V_N$ and produce a signal indicative of the current flow through a load connected to the H-bridge circuit. The circuit 300 may comprise an amplifier having a differential output and configured as a summing circuit. The $V_P$ and $V_N$ sense signals may be combined at an inverting input of the amplifier. The $V_{DD}$ and $V_{SS}$ power rail voltages may be combined at a non-inverting input of the amplifier. Using the current flow convention for $I_{M1}$ and $I_{M2}$ shown in FIG. 2, the amplifier output $V_{OC}$ may be determined as follows:

$$V_{OC} = \frac{R_f}{R_{in}}(V_{DD} - V_P + V_{SS} - V_N)$$

$$V_{OC} = \frac{R_{sense}R_f}{R_{in}}(I_{M1} + I_{M2}) = \frac{R_{sense}R_f}{R_{in}}I_{load},$$

where $V_{OC}$ is a voltage level representative of the current flow through the load,
$R_{in}$ is the input resistance of the input resistors,
$R_f$ is the feedback resistance of the feedback resistors,
$R_{sense}=R_{sns1}=R_{sns2}$,
$V_P=I_{M1} \times R_{sense}$,
$V_N=I_{M2} \times R_{sense}$, and
$I_{load}=I_{M1}+I_{M2}$, the current flow through the load.
As can be appreciated, the output of circuit 300 can continuously represent the current flow through the load. In some embodiments, the output $V_{OC}$ may be provided to control electronics (not shown) to disconnect the amplifier 100 from the load, or to otherwise disable power to the load in response to $V_{OC}$ exceeding a predetermined threshold.

Figure 4A:
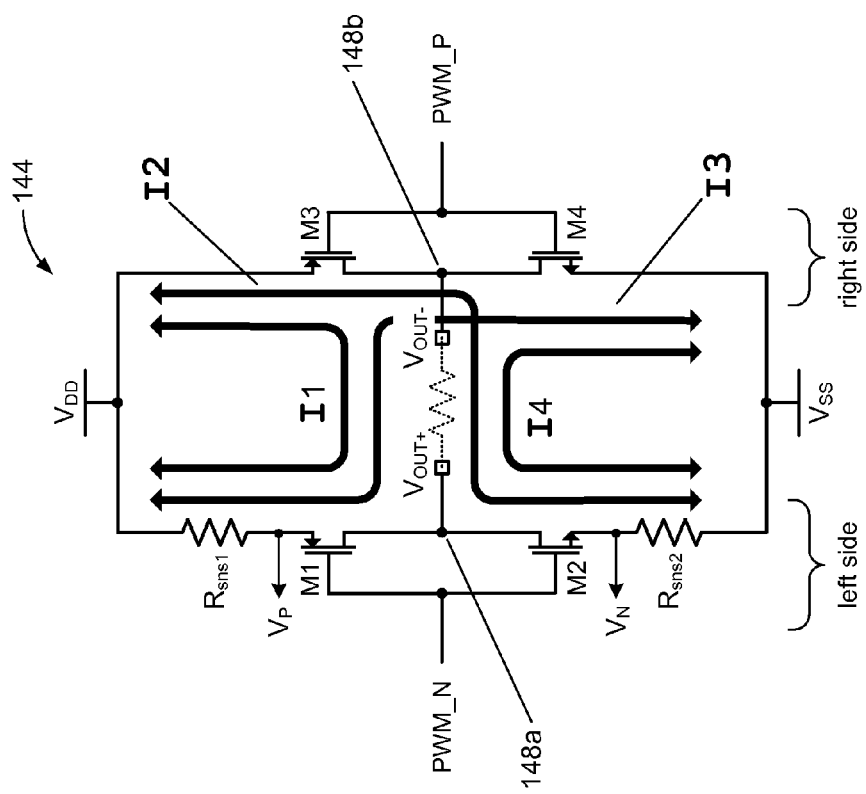

Referring to FIGS. 4 and 4A, the discussion will now turn to a description of the various current flows in the output stage 144 during typical operation of the amplifier 100. FIG. 4 illustrates the various states (HI, LO) that the PWM_P and PWM_N control signals can take. Each combination of states is represented by a shaded region in the figure. As explained above, the pulse modulator 102 generates 3-state switching drive signals. FIG. 4 illustrates examples of the three switching states. The first switching state may defined by PWM_P (LO) and PWM_N (HI), in which case the outputs $V_{OUT+}$ and $V_{OUT-}$ would be connected to the $V_{DD}$ and $V_{SS}$ power rails respectively. The second switching state may be defined by PWM_P (HI) and PWM_N (LO), in which case the outputs $V_{OUT+}$ and $V_{OUT-}$ would be connected to the $V_{SS}$ and $V_{DD}$ power rails respectively. The third switching state may be defined by the PWM_P and PWM_N control signals both being HI or both being LO, in which case the outputs $V_{OUT+}$ and $V_{OUT-}$ would both be connected either to the $V_{SS}$ power rail or to the $V_{DD}$ power rail.

Referring to FIG. 4A, when the PWM_P and the PWM_N control signals are both LO, switches M1 and M3 are ON (conductive) and switches M2 and M4 are OFF (non-conductive). The current $I_{load}$ across the load connected to nodes 148a and 148b will comprise the current flow I1, which can be sensed by sense resistor $R_{sns1}$. When the PWM_P control signal is LO and the PWM_N control signal is HI, switches M2 and M3 are ON (conductive) and switches M1 and M4 are OFF (non-conductive). The load current $I_{load}$ will comprise the current flow I2, which can be sensed by sense resistor $R_{sns2}$. When the PWM_P control signal is HI and the PWM_N control signal is LO, switches M1 and M4 are ON (conductive) and switches M2 and M3 are OFF (non-conductive). The load current $I_{load}$ will comprise the current flow I3, which can be sensed by sense resistor $R_{sns1}$. When the PWM_P and the PWM_N control signals are both HI, switches M2 and M4 are ON (conductive) and switches M1 and M3 are OFF (non-conductive). The current $I_{load}$ will comprise the current flow I4, which can be sensed by sense resistor $R_{sns2}$.

It can be appreciated from the foregoing that there is no combination of the PWM_P and PWM_N control signals where the $I_{load}$ current Road is not sensed. The configuration of sense resistors $R_{sns1}$ and $R_{sns2}$ thus can provide improved accuracy in detecting load current.

Figure 5:
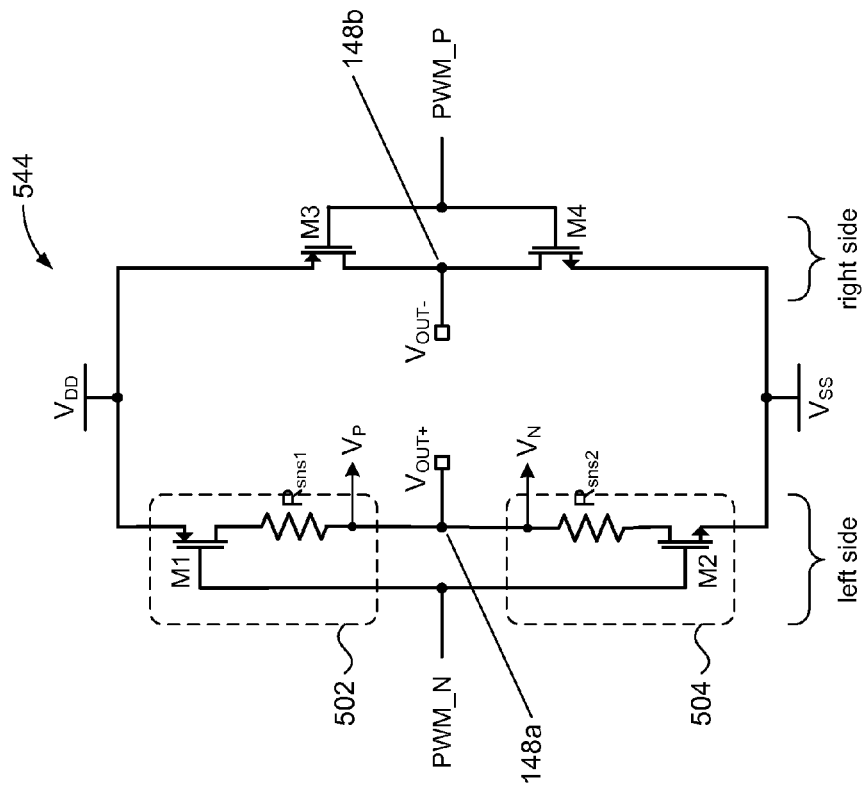
FIGS. 5-7 illustrate alternate embodiments of an output stage in accordance with the present disclosure.
Figure 7:
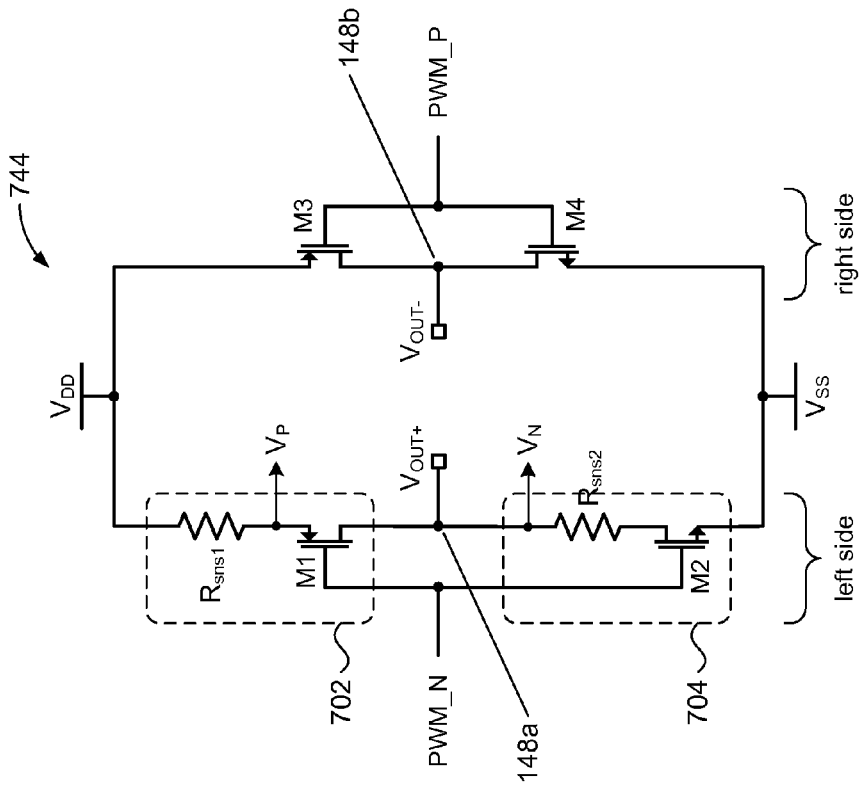
Figure 6:
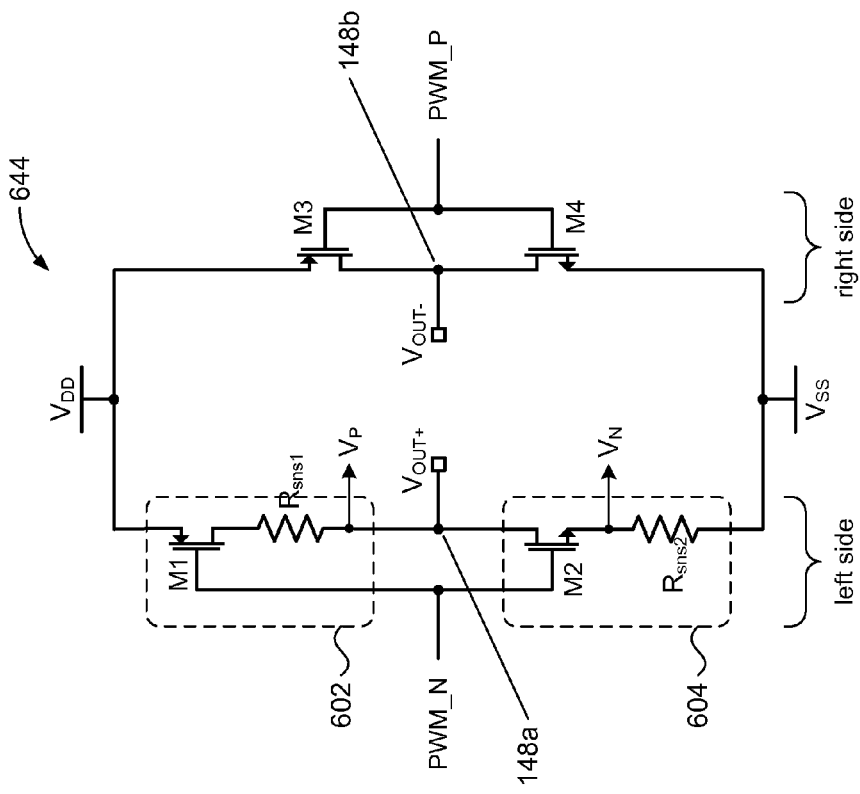

FIGS. 5, 6, and 7 illustrate alternative embodiments in accordance with the present disclosure. FIG. 5 illustrates an embodiment of an output stage 544 in accordance with the present disclosure comprising another arrangement of sense resistors $R_{sns1}$ and $R_{sns2}$. The output stage 544 comprises a first switching unit 502 comprising switch M1 connected between the first power rail $V_{DD}$ and sense resistor $R_{sns1}$. Sense resistor $R_{sns1}$ is connected between M1 and node 148a. A voltage signal $V_P$ may be sensed at node 148a. Voltage $V_P$ indicates a voltage drop across $R_{sns1}$ and thus is representative of the current flow through $R_{sns1}$. The output stage 544 further comprises a second switching unit 504 comprising switch M2 connected between the second power rail $V_{SS}$ and sense resistor $R_{sns2}$. Sense resistor $R_{sns2}$ is connected between M2 and node 148a. A voltage signal $V_N$ may be sensed at node 148a. Voltage $V_N$ indicates a voltage drop across $R_{sns2}$ and thus represents a current flow through $R_{sns2}$.

FIG. 6 illustrates an embodiment of an output stage 644 in accordance with the present disclosure comprising yet another arrangement of sense resistors $R_{sns1}$ and $R_{sns2}$. The output stage 644 comprises a first switching unit 602 having switch M1 connected between the first power rail $V_{DD}$ and sense resistor $R_{sns1}$. Sense resistor $R_{sns1}$ is connected between M1 and node 148a. A voltage signal $V_P$ may be sensed at node 148a. Voltage $V_P$ indicates a voltage drop across $R_{sns1}$ and thus the current flow through $R_{sns1}$. The output stage 644 further comprises a second switching unit 504 comprising sense resistor $R_{sns2}$ connected between the second power rail $V_{SS}$ and switch M2. Switch M2 is connected between $R_{sns2}$ and node 148a. A voltage signal $V_N$ may be sensed at the connection between M2 and $R_{sns2}$. Voltage $V_N$ indicates a voltage drop across $R_{sns2}$ and thus represents a current flow through $R_{sns2}$.

FIG. 7 illustrates an embodiment of an output stage 744 in accordance with the present disclosure comprising still another arrangement of sense resistors $R_{sns1}$ and $R_{sns2}$. The output stage 744 comprises a first switching unit 702 comprising sense resistor $R_{sns1}$ connected between the first power rail $V_{DD}$ and switch M1. Switch M1 is connected between $R_{sns1}$ and node 148a. A voltage signal $V_P$ may be sensed at the connection between M1 and $R_{sns1}$. Voltage $V_P$ indicates a voltage drop across $R_{sns1}$ and thus a current flow through $R_{sns1}$. The output stage 744 further comprises a second switching unit 704 comprising switch M2 connected between the second power rail $V_{SS}$ and sense resistor $R_{sns2}$. Sense resistor $R_{sns2}$ is connected between M2 and node 148a. A voltage signal $V_N$ may be sensed at node 148a. Voltage $V_N$ indicates a voltage drop across $R_{sns2}$ and thus a current flow through $R_{sns2}$.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

We claim the following:

1. An amplifier circuit comprising:
    a driver stage having an input part to receive driving signals and an output part to output control signals responsive to the driving signals; and
    an H-bridge circuit comprising a first driving side and a second driving side,
    the first driving side comprising first and second switching devices and first and second sense resistors connected in series with the first and second switching devices, the first driving side further comprising a first input node connected to the driver stage, the first driving side further comprising a first output node to connect to a load;
    the second driving side comprising third and fourth switching devices connected in series and absent any sense resistors, the second driving side further comprising a second input node connected to the driver stage, the second driving side further comprising a second output node to connect to the load; and
    a pulse modulator operative to generate drive signals for switching control of the first, second, third, and fourth switching devices.

2. The amplifier circuit of claim 1 further comprising a current sensor operative to output a voltage level indicative of a current flow through a load responsive to voltages on the first and second sense resistors.

3. The amplifier circuit of claim 1 wherein the first driving side is a left side of an H-bridge circuit and the second driving side is a right side of the H-bridge circuit.

4. The amplifier circuit of claim 1 wherein the first switching device and the first sense resistor are connected in series on one side of the first output node, wherein the second switching device and the second sense resistor are connected in series on the other side of the first output node.

5. The amplifier circuit of claim 1 wherein the first and second sense resistors are connected together.

6. The amplifier circuit of claim 1 wherein the first and second switching devices are connected together.

7. The amplifier circuit of claim 1 wherein the first switching device is connected to the first sense resistor, the first sense resistor is connected to the second switching device, and the second switching device is connected to the second sense resistor.

8. An amplifier circuit comprising:
an H-bridge circuit;
a first side of the H-bridge circuit comprising:
    a first switching unit comprising a first transistor device connected to a first sense resistor;
    a second switching unit comprising a second transistor device connected to a second sense resistor; and
    a first output node defined by a connection between the first switching unit and the second switching unit, the first output node being suitable for connecting to a first input of a load;
a second side of the H-bridge circuit comprising:
    a third switching unit;
    a fourth switching unit; and
    a second output node defined by a connection between the third and fourth switching units, the second output node being suitable for connecting to a second input of the load,
    the second side of the H-bridge circuit absent any sense resistors; and
a pulse modulator operative to generate drive signals for switching control of the first, second, third, and fourth switching units.

9. The amplifier circuit of claim 8 wherein the first switching unit and the fourth switching unit are conductive during a first switching state, wherein the second switching unit and the third switching unit are conductive during a second switching state, wherein either the first and third switching units are conductive or the second and fourth switching units are conductive during a third switching state.

10. The amplifier circuit of claim 8 further comprising a current detection circuit connected to the first and second sense resistors, the current detection circuit operative to produce an output voltage responsive to voltages on the first and second sense resistors.

11. The amplifier circuit of claim 8 wherein the first switching unit is further connected to a first power rail and the second switching unit is further connected to a second power rail.

12. The amplifier circuit of claim 11 wherein the third switching unit is further connected to the first power rail and the fourth switching unit is further connected to the second power rail.

13. The amplifier circuit of claim 8 wherein the first switching unit and the second switching unit are respective high-side and low-side of the left side of an H-bridge.

14. The amplifier circuit of claim 8 wherein the first transistor device and the second transistor device are connected to the first node.

15. The amplifier circuit of claim 8 wherein the first transistor device and the second sense resistor are connected to the first node.

16. The amplifier circuit of claim 8 wherein the first sense resistor and the second transistor device are connected to the first node.

17. The amplifier circuit of claim 8 wherein the first sense resistor and the second sense resistor are connected to the first node.

18. The amplifier circuit of claim 8 wherein the second driving side further comprises third and fourth sense resistors connected together in series with the third and fourth switching devices.

19. An amplifier circuit comprising:
an H-bridge circuit comprising:
    a first side of the H-bridge circuit having first and second switching transistors connected in series with first and second sense resistors; and
    a second side of the H-bridge circuit having third and fourth switching transistors connected in series, the second side of the H-bridge circuit absent any sense resistors;
a current detection circuit connected to the first and second sense resistors, the current detection circuit operative to produce an output voltage responsive to voltages on the first and second sense resistors; and
a pulse modulator operative to generate drive signals for switching control of the first, second, third, and fourth switching transistors.

20. The amplifier circuit of claim 19 further comprising a connection to a first power rail and a connection to a second power rail, wherein the first and third switching transistors are connected to the connection to the first power rail, wherein the second and fourth switching transistors are connected to the connection to the second power rail.

21. The amplifier circuit of claim 19 further comprising a connection to a first power rail and a connection to a second power rail, wherein the first sense resistor is connected to the connection to the first power rail, wherein the second sense resistor is connected to the connection to the second power rail.

* * * * *